United States Patent [19]
Koen

[11] Patent Number: 5,461,922
[45] Date of Patent: Oct. 31, 1995

[54] PRESSURE SENSOR ISOLATED WITHIN HOUSING HAVING INTEGRAL DIAPHRAGM AND METHOD OF MAKING SAME

[75] Inventor: Edward F. Koen, Danville, Calif.

[73] Assignee: Lucas-Novasensor, Fremont, Calif.

[21] Appl. No.: 98,182

[22] Filed: Jul. 27, 1993

[51] Int. Cl.[6] .................................................. G01L 9/00
[52] U.S. Cl. ........................ 73/756; 73/702; 73/706; 73/716; 73/715; 73/723; 128/675
[58] Field of Search .............................. 73/702, 706, 716, 73/715, 723; 128/675

[56] References Cited

U.S. PATENT DOCUMENTS

| | | | |
|---|---|---|---|
| 4,686,764 | 8/1987 | Adams et al. | 73/706 |
| 4,691,573 | 9/1987 | Varnum et al. | 73/723 |
| 4,784,721 | 11/1988 | Holmen et al. | 73/715 |
| 4,920,972 | 5/1990 | Frank et al. | 128/675 |
| 4,993,265 | 2/1991 | Koen et al. | 73/706 |
| 5,076,147 | 12/1991 | Hegner et al. | 73/723 |
| 5,307,684 | 5/1994 | Moses et al. | 73/723 |

Primary Examiner—Richard Chilcot
Assistant Examiner—Jewel V. Artis
Attorney, Agent, or Firm—Wilson, Sonsini, Goodrich & Rosati

[57] ABSTRACT

A pressure transducer is provided for measuring pressure within a measurand environment, the transducer comprising a header which includes a substantially nondeformable molded housing formed from a first thermoplastic material defining a cavity and first and second openings into the cavity and a resilient diaphragm formed from the first thermoplastic material molded to the housing and spanning the first opening; a pressure sensing device disposed within the housing; and a pressure transfer medium disposed within the cavity so as to couple the diaphragm to the pressure sensing device.

23 Claims, 14 Drawing Sheets

SECTION 7-7

SECTION 9-9

PRESSURE SENSOR ISOLATED WITHIN HOUSING HAVING INTEGRAL DIAPHRAGM AND METHOD OF MAKING SAME

BACKGROUND OF THE INVENTION

1. Field of the Invention

The invention relates to the isolation of pressure sensing devices from environmental contaminants, and more specifically, to achieving optimal coupling between a diaphragm exposed to a measurand environment and a pressure sensing device isolated within a protective housing.

2. Description of the Related Art

Pressure sensors which include a protective thermoplastic housing with a pressure sensing device isolated inside are well known. Moreover, the use of a diaphragm secured to the housing in conjunction with a substantially non-compressible pressure transfer medium within the housing to couple the diaphragm to the pressure sensing device is well know. Unfortunately, however, there have been problems with the use of such diaphragms in such pressure sensors.

In particular, U.S. Pat. No. 4,686,764, entitle "MEMBRANE PROTECTED PRESSURE SENSOR" which issued to Adams et al., on Aug. 18, 1987 discloses the sensor in FIG. 1 which includes a diaphragm 32 which is rolled into place as shown by the arrow 33. A problem associated with the approach suggested by Adams et al., is that it does not provide reliable initial pressurization sensitivity. Another problem is that sensitivity may vary over time. Furthermore, the proposed method of manufacture can be time consuming, costly and somewhat unreliable.

U.S. Pat. No. 4,993,265 entitled "PROTECTED PRESSURE SENSOR AND METHOD OF MAKING" issued to Koen et al., on Feb. 19, 1991 discloses the poured in place diaphragm shown in FIG. 2. While this diaphragm generally has been successful, there have been shortcomings with its use. For example, the surface of the diaphragm 32 shown in FIG. 2 has a relatively high co-efficient of friction, and therefore, can tear relatively easily. Moreover, the diaphragm 32 is secured to the header 11 using an intermediate primer which unfortunately can result in a somewhat unreliable (and process dependent) bond. Moreover, the diaphragm 32 has been found to be relatively permeable to environmental gases. Additionally, the sensing element 14 is mounted so as to receive a top-side pressure which can result in incremental damage to the wire bonds 18 over time.

U.S. Pat. No. 4,920,972 entitled "GEL-FILLED BLOOD PRESSURE TRANSDUCER" which issued to Frank et al., on May 1, 1990, includes the diaphragm 30 shown in FIG. 3. That diaphragm 30 has a rim 31 which is inserted into an annular channel 29 in order to mechanically hold the diaphragm 30 in place. A difficulty with the approach taught by Frank et al. is that the diaphragm 30 must be biased slightly in order to distend the diaphragm, presumably to remove any irregularities in the diaphragm surface which may have been introduced when the diaphragm was mechanically assembled.

Yet another earlier pressure sensor 105 is shown in FIG. 4. The sensor 105 includes a housing 106 and a gel-filled T0-8 sensor package 108 mounted on a circuit board 110. A polyurethane diaphragm 112 is attached to the top of the housing 106 using an acrylic adhesive. The housing is filled with a non-compressable pressure transfer medium such as a gel. The T0-8 package 108 is inserted into the gel within the housing so that the gel within the T0-8 serves as a pressure transfer medium which couples pressure from the diaphragm 112 to a pressure sensing device (not shown) within the housing. One problem experienced with pressure sensors of the type illustrated in FIG. 4 has been failure of the adhesive due to corrosive solvents in the environment.

Thus, there has been a need for an improved pressure sensor. The present invention meets that need.

SUMMARY OF THE INVENTION

The present invention provides a novel pressure sensor. The new sensor includes an integral one-piece header which comprises a protective housing formed from a hard thermoplastic material and a resilient diaphragm formed from a second material which includes the same base material as the first thermoplastic material. A pressure sensing device is secured in place inside the housing. A pressure transfer medium within the housing serves to couple the diaphragm to the pressure sensing device.

These and other purposes and advantages of the present invention will become more apparent to those skilled in the art from the following detailed description in conjunction with the appended drawings in which:

DETAILED DESCRIPTION OF THE PREFERRED EMBODIMENTS

The present invention comprises a novel pressure sensor and associated method of manufacture. The following description is presented to enable any person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
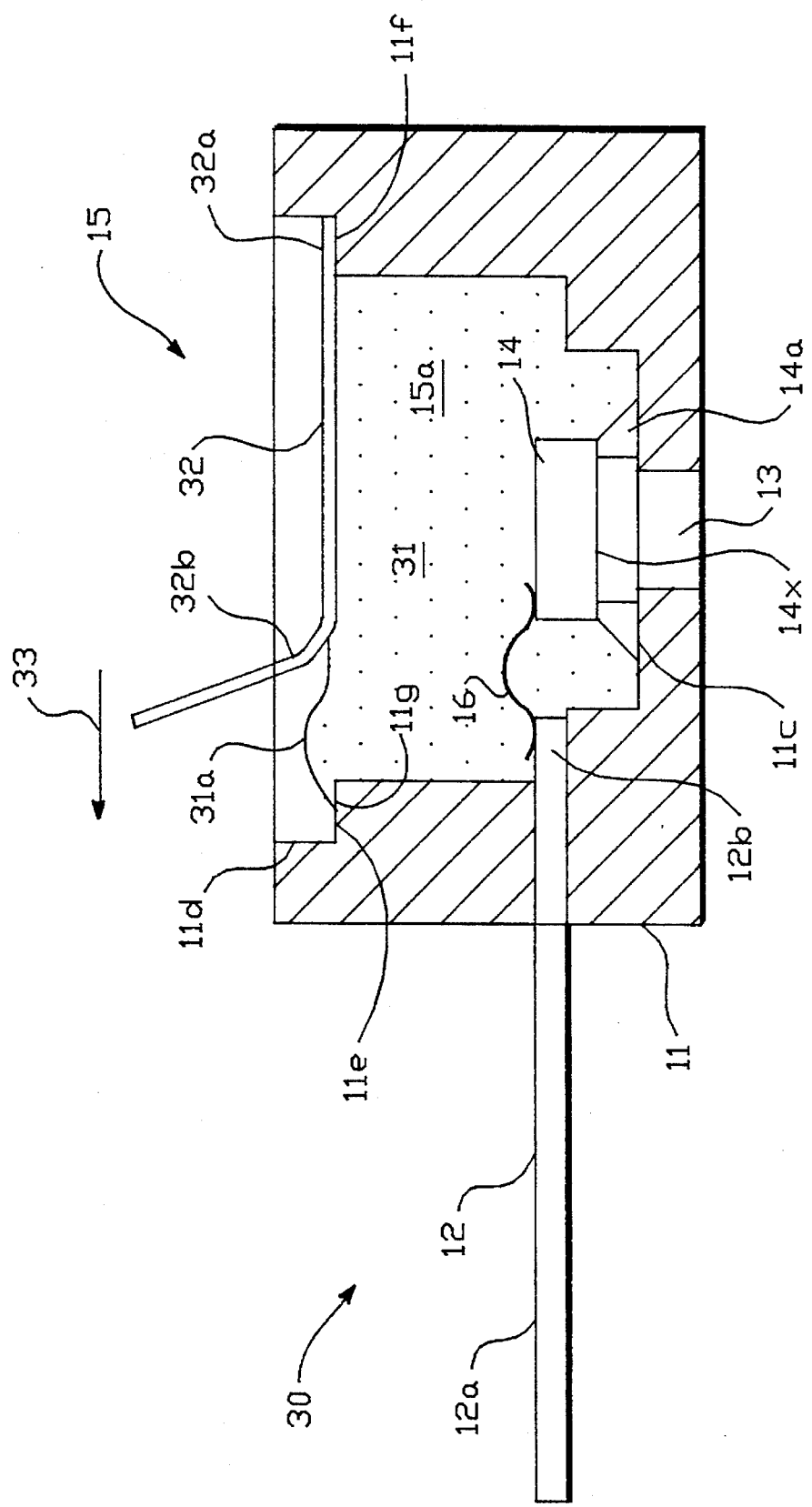
FIG. 1 is a cross-sectional view of a first earlier pressure sensor in which a diaphragm is rolled into place.
Figure 2:
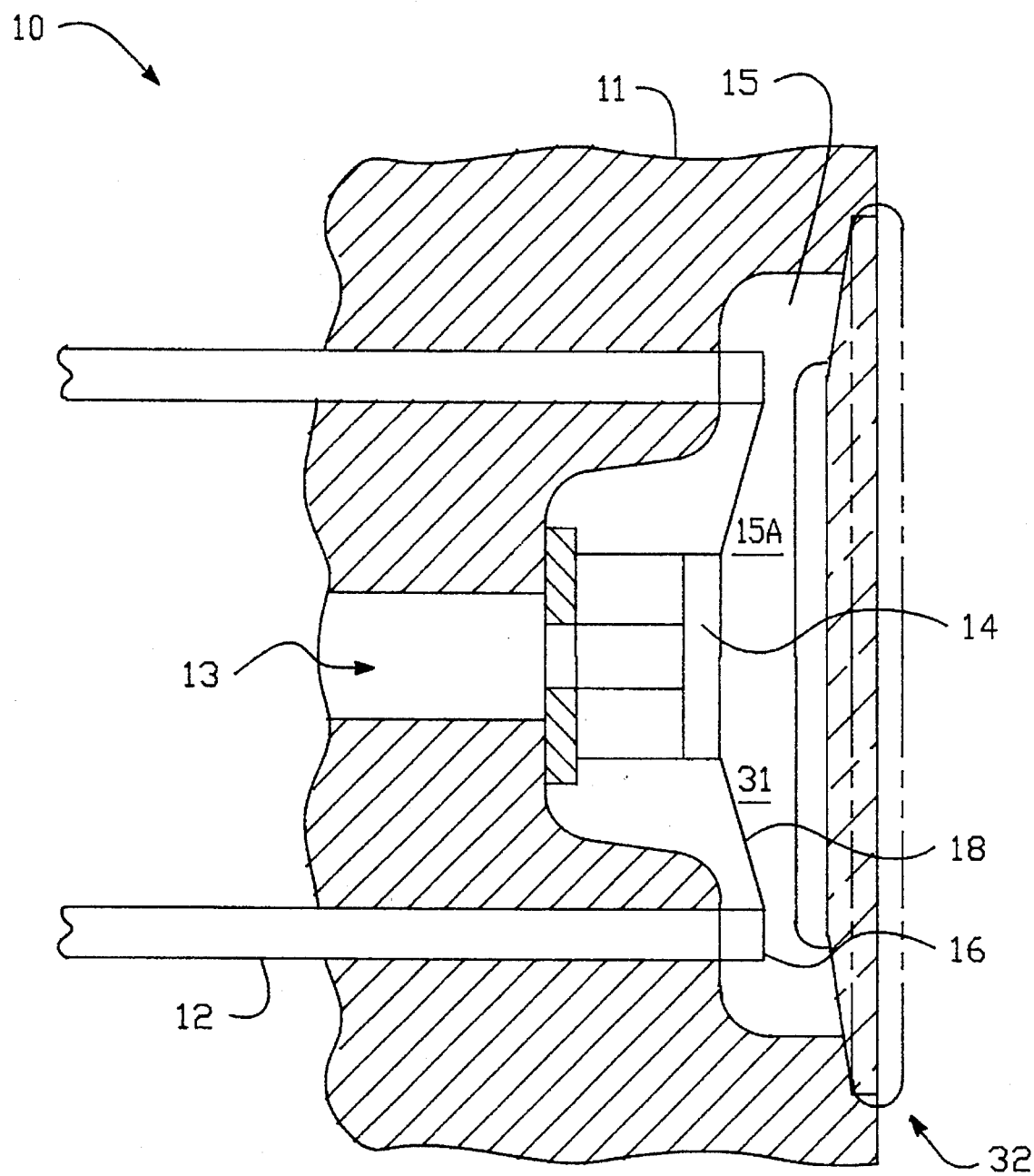
FIG. 2 is a cross-sectional view of a second earlier pressure sensor in which a diaphragm is poured into place and secured using an adhesive material.
Figure 3:
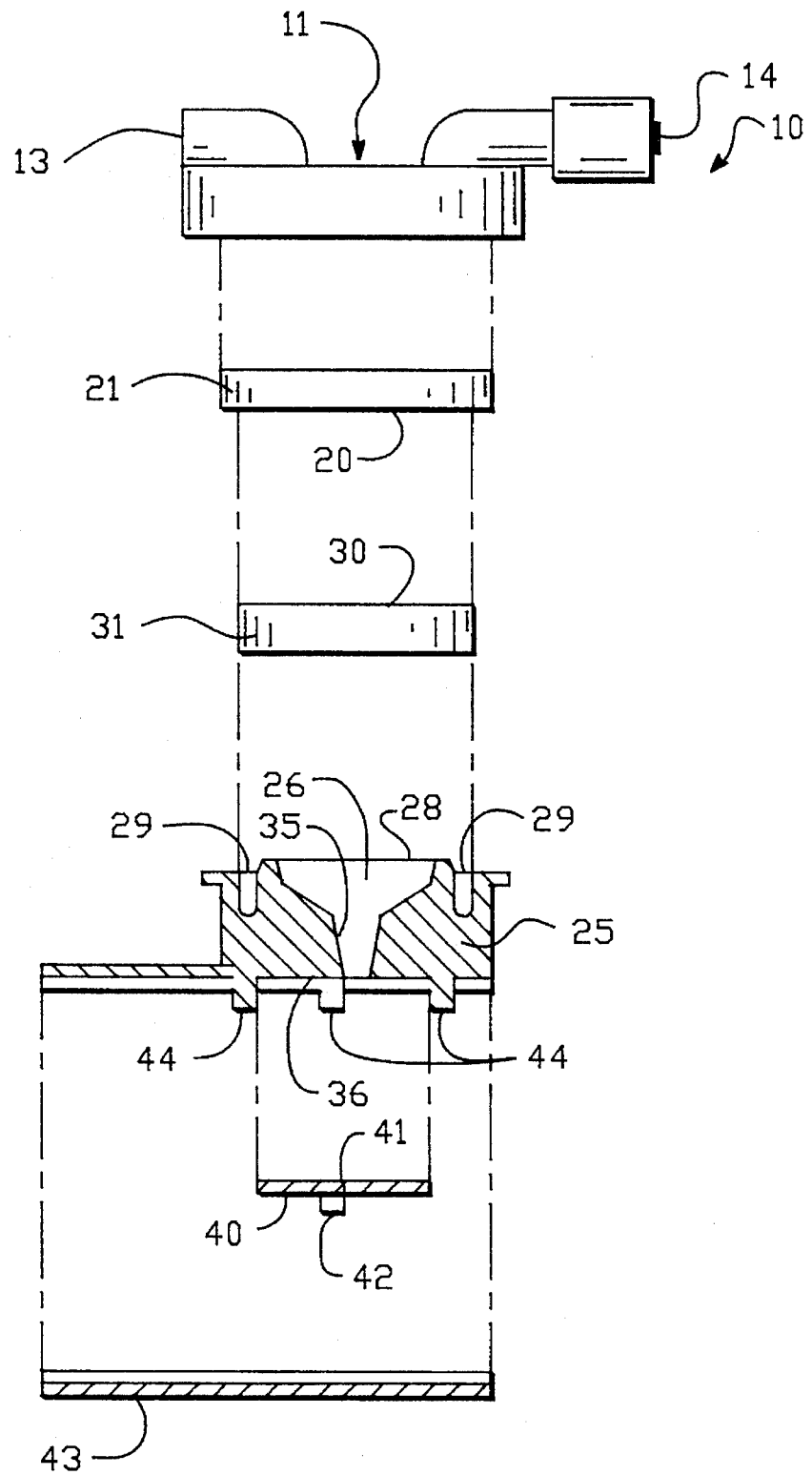
FIG. 3 is an exploded cross-sectional view of a third earlier pressure sensor in which a pressure sensor is mechanically held in place by a retaining ring.
Figure 4:
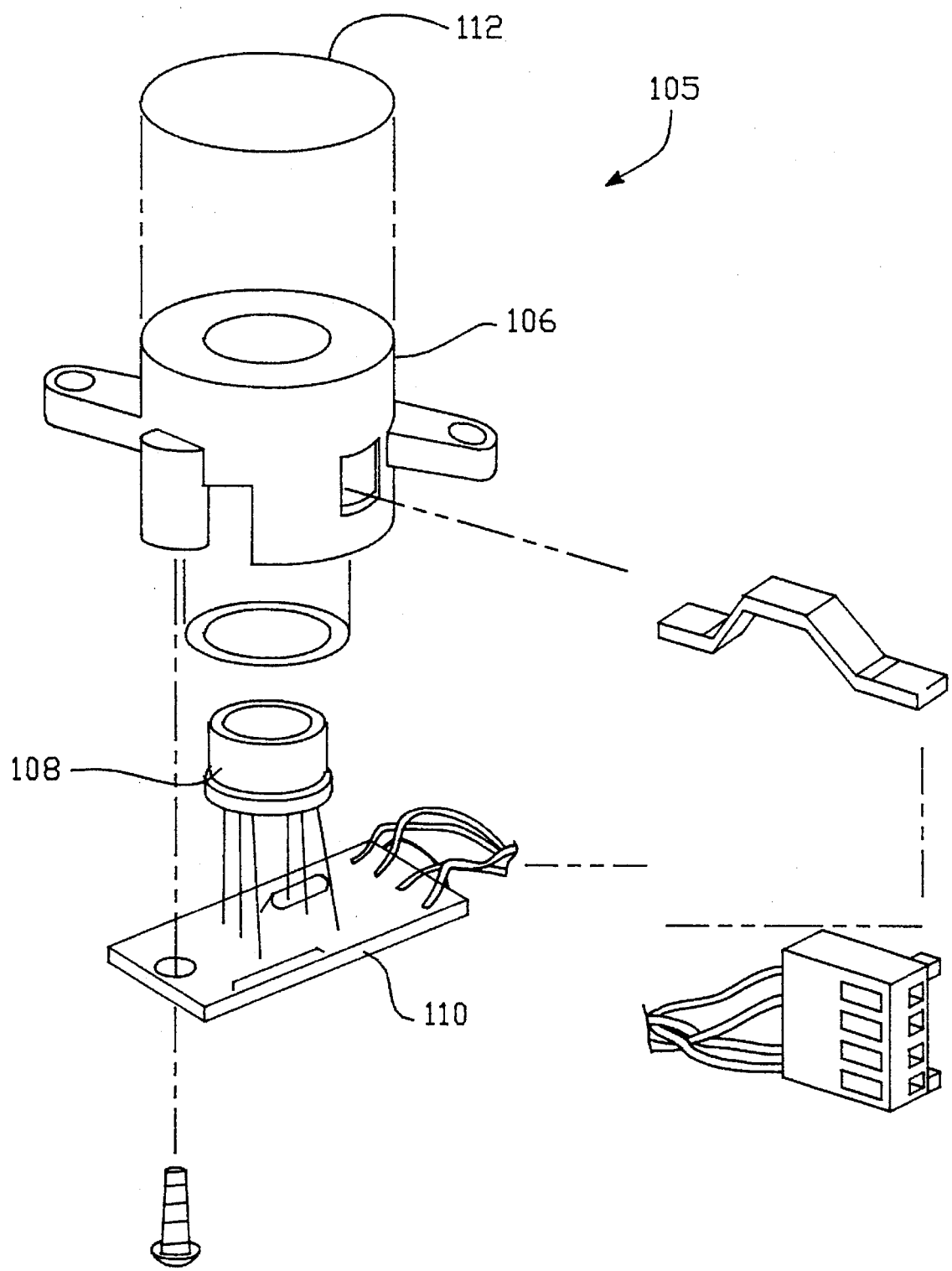
FIG. 4 is an exploded perspective view of a fourth earlier pressure sensor in which the diaphragm is held in place by an adhesive material.
Figure 5:
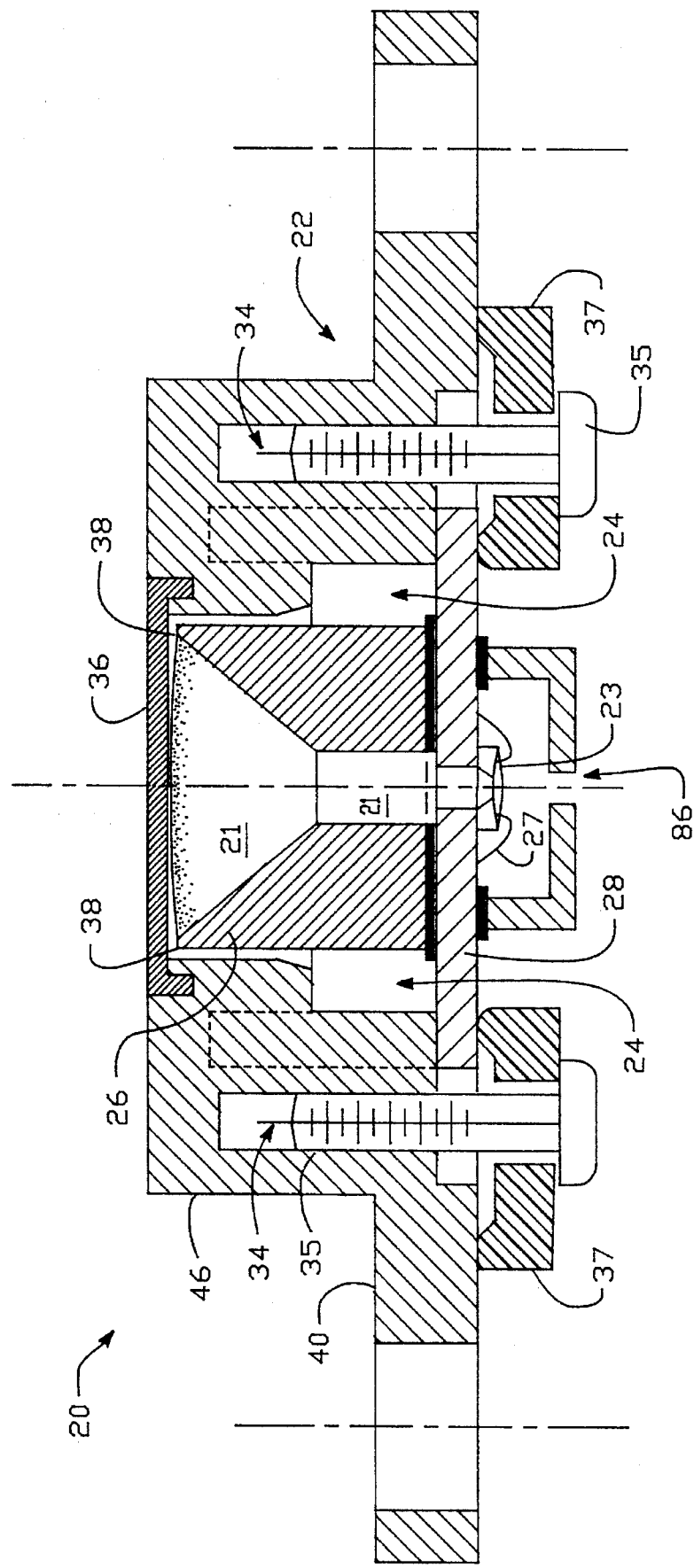
FIG. 5 is a cross-sectional view of first pressure sensor in accordance with the invention.

Referring to the illustrative drawing of FIG. 5, there is shown a cross-sectional view of a first pressure sensor 20, in accordance with the present invention. The sensor 20 includes a novel overmolded header which includes a header body 22 and a diaphragm 36. The header body 22 serves as a hard protective housing for a pressure sensing device 23 protectively isolated inside, and the diaphragm 36 provides a resilient surface responsive to pressure changes in a measurand environment.

The header body 22 and the diaphragm 36 are bonded together through a molding process so as to form the overmolded header which is a single integral unit. The bonding of the header body 22 with the diaphragm 36 is facilitated by the fact that both components are formed from the same base material. In a current embodiment, that material is a thermoplastic which means that the header body 22 can be reheated and reformed. In the presently preferred embodiment, the common base material is a polymer, namely polypropylene. More specifically, the header body 22 is formed from thirty percent glass filled polypropylene, and the diaphragm 36 is formed from rubber filled polypropylene. In particular, the diaphragm is Shore A 55 Durometer Santoprene manufactured by the Advanced Elastomer Systems Division of Monsanto Corp. in Akron, Ohio. The glass fill gives the header body its hardness. The rubber fill gives the diaphragm its resiliency. The identical (polymer) base material facilitates molding the two into a single unit. Thus, the integral overmolded header comprises a unitary structure with a hard header housing within which to isolate a sensing device and a resilient diaphragm responsive to measurand environment pressure changes.

During manufacture of the overmolded header, the header body 22 is first molded using routine molding processes well known to those skilled in the art which need not be explained herein. The header body 22 then is placed into another mold form, and molten Santoprene is injected into that mold form at an elevated temperature. The temperature is high enough to melt the surfaces of the header body 22 that contact the hot Santoprene. Upon cooling, a continuous crystalline structure is formed across what was the boundary of the header body 22 and the diaphragm 36. This continuous structure can be formed because of the common thermoplastic base material. The result is a single continuous thermoplastic overmolded header which includes the hard header body 22 and the resilient diaphragm 36.

The header body 22 includes a housing 46 which defines a cavity 24 for receiving a pressure transfer medium 21 used to transfer changes in a measurand pressure from the diaphragm 36 to the sensing device 23. The pressure transfer medium should be substantially non-compressible in the pressure range of interest and should have a relatively low coefficient of thermal expansion. In a current embodiment, the medium 21 is formed from fluorosilicone in a high A to low B mixture in which A is the base material, and B is the catalyst. The catalyst stimulates cross-linking which results in curing. An advantage of fluorosilicone is that it is relatively stable gel after curing.

In the present embodiment, the pressure transfer medium 21 is held in a container called a gel-cup 26 which is secured within the header housing cavity 24. The gel-cup 26 is fastened to a ceramic circuit board 28 which has the pressure sensitive device 23 mounted thereon as explained below.

Figure 16:
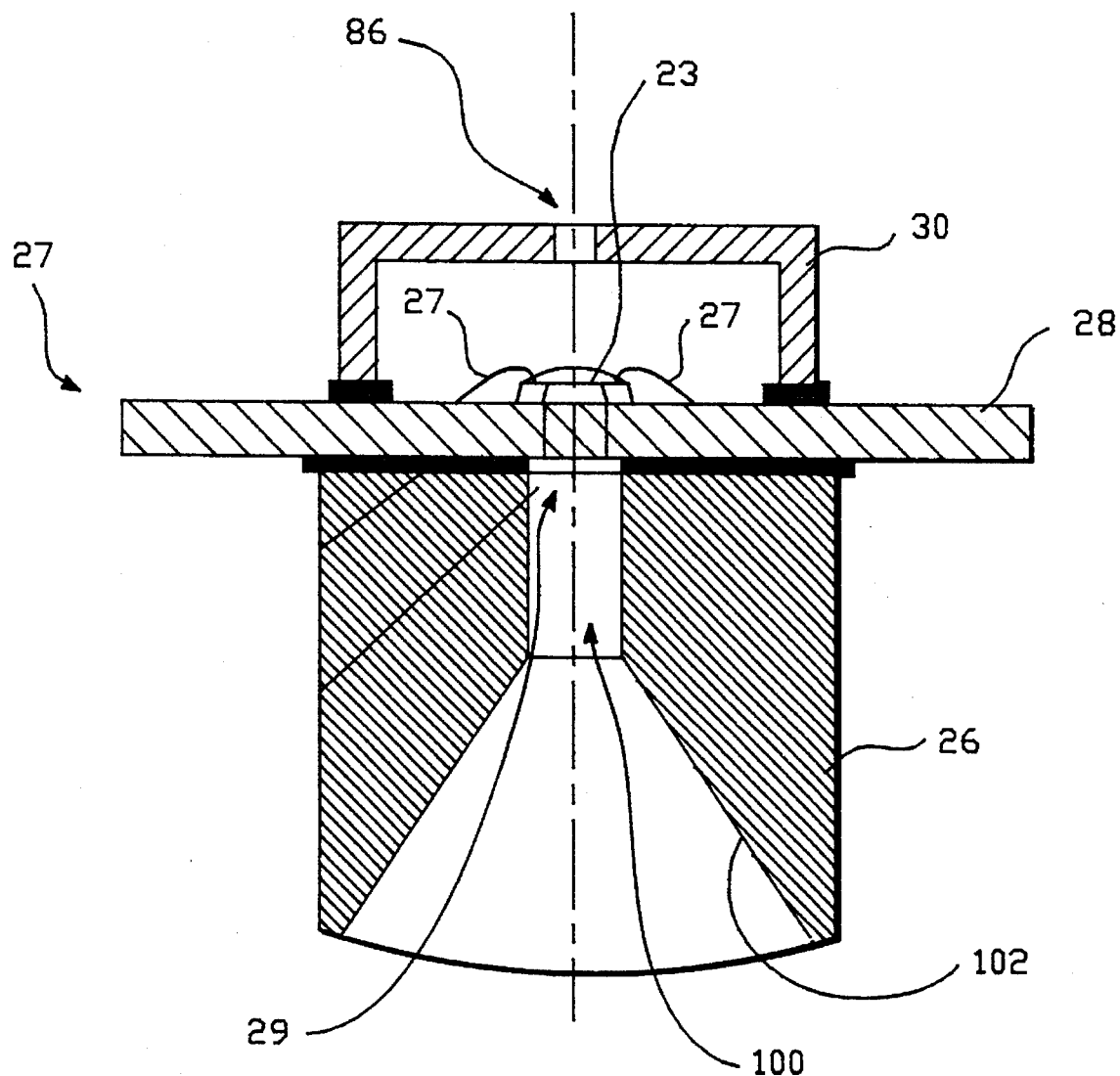
FIG. 16 is a cross-sectional view of a gel-cup and circuit board with a semiconductor sensor mounted thereon.

Referring to the illustrative drawings of FIG. 16, there is shown a cross-sectional view of the gel-cup assembly 27 of the first pressure sensor 20. The assembly 27 includes a circuit board 28, the gel-cup 26 and a protective capsule 30. The pressure sensing device 23 is secured to the circuit board 28 using a room temperature vulcanizing silicon rubber (RTV). The circuit board defines a measurand pressure vent hole 29 therethrough which communicates with a diaphragm portion of the pressure sensing device 23. The sensing device is wire bonded to the circuit board 28 by wires 27. Protective gel is placed over the device and the wire bonds. The protective capsule 30 is secured to the board 28 with epoxy. The gel-cup is secured to an opposite side of a circuit board using epoxy. The gel-cup 26 defines a narrow cylindrical cavity 100 which communicates with a back inside (non-wirebonded side) of the device 23 through the hole 29 in the circuit board. The gel-cup also defines a wider conical cavity region 102 which communicates with the cylindrical cavity region 100.

After the assembly 27 is completed, the gel-cup 26 is first partially filled with uncured gel. That gel material is then degassed, and the remainder of the gel-cup is filled with more uncured gel material. That gel then also is degassed. The gel in the gel-cup is then cured in an oven at approximately 150° C. for approximately two hours. The result is cured gel which serves as the pressure transfer medium 21.

The reason for both a conical shape cavity region and a cylindrical shape cavity region within the gel-cup is to minimize the amount of pressure transfer material between the diaphragm 36 and the sensing device 23 while at the same time minimizing vertical expansion of the cured pressure sensing material with increased temperature. Such vertical expansion could impair sensing accuracy. Providing a wide conical region provides increased surface area so that overall vertical expansion is reduced.

In a present embodiment, the pressure sensing device 23 has two sides. One side is exposed to the measurand pressure, and the other side is exposed to a reference or ambient pressure. As explained above, the side of the device 23 exposed to the measurand pressure is attached to the circuit board and exposed to the pressure transfer medium 21 within the gel-cup. The opposite side, which is exposed to the reference or ambient pressure, is enclosed within the protective capsule 30. A reference pressure vent hole 86 formed in the bottom of the capsule 30 exposes the opposite side of the sensing device to the reference or ambient pressure.

In a present embodiment, the device 23 comprises a semiconductor electromechanical differential pressure sensor having a thin semiconductor diaphragm. A Wheatstone Bridge circuit is used to sense changes in the flexure of the semiconductor diaphragm induced by differences between the measurand and the reference pressures. This type of circuit is well known to those skilled in the art and need not be described in detail herein.

It will be noted that the sensing device is mounted to receive backside pressure. That is, the wire bonds 23 are not exposed to the pressure transfer medium, and therefore, are not exposed to as much mechanical stress due to flexure of the diaphragm 36.

While the preferred embodiment uses a sensing device with a thin semiconductor diaphragm, other types of sensing devices could be employed. For example, an alternative sensing device could be a strain gauge using a discrete resistor instead of a Wheatstone Bridge circuit.

The circuit board 28 is secured to the header body 22 by an adhesive material, such as a room temperature cure epoxy, applied to substantially flat regions 32 of the header body 22. The header 22 has holes 34 which receive screws 35 which secure clamps 37 in place. The clamps 37 are used to more firmly hold the circuit board and the sensing device 23 in place. The sensing device 21 must remain in a fixed position relative to the header body 22 in order to produce accurate pressure measurements.

The open top of the gel-cup 26 which is filled with the pressure transfer medium 21, is hermetically sealed within the header housing in order to ensure proper coupling from the diaphragm 36 through the medium 21 to the sensing device 23. An encapsulating material 38 is used to hermetically seal the transfer medium 21 between the gel-cup 26 and the diaphragm 36. In the present embodiment, the encapsulating material 38 is formed from dimethyl silicone gel mixed in a high B to low A ratio. When cured the encapsulating material 38 forms a hermetical seal between the header housing 46 and the top of the gel cup container 26 the transfer medium 38 is sealed inside coupled to the diaphragm 36.

Figure 6:
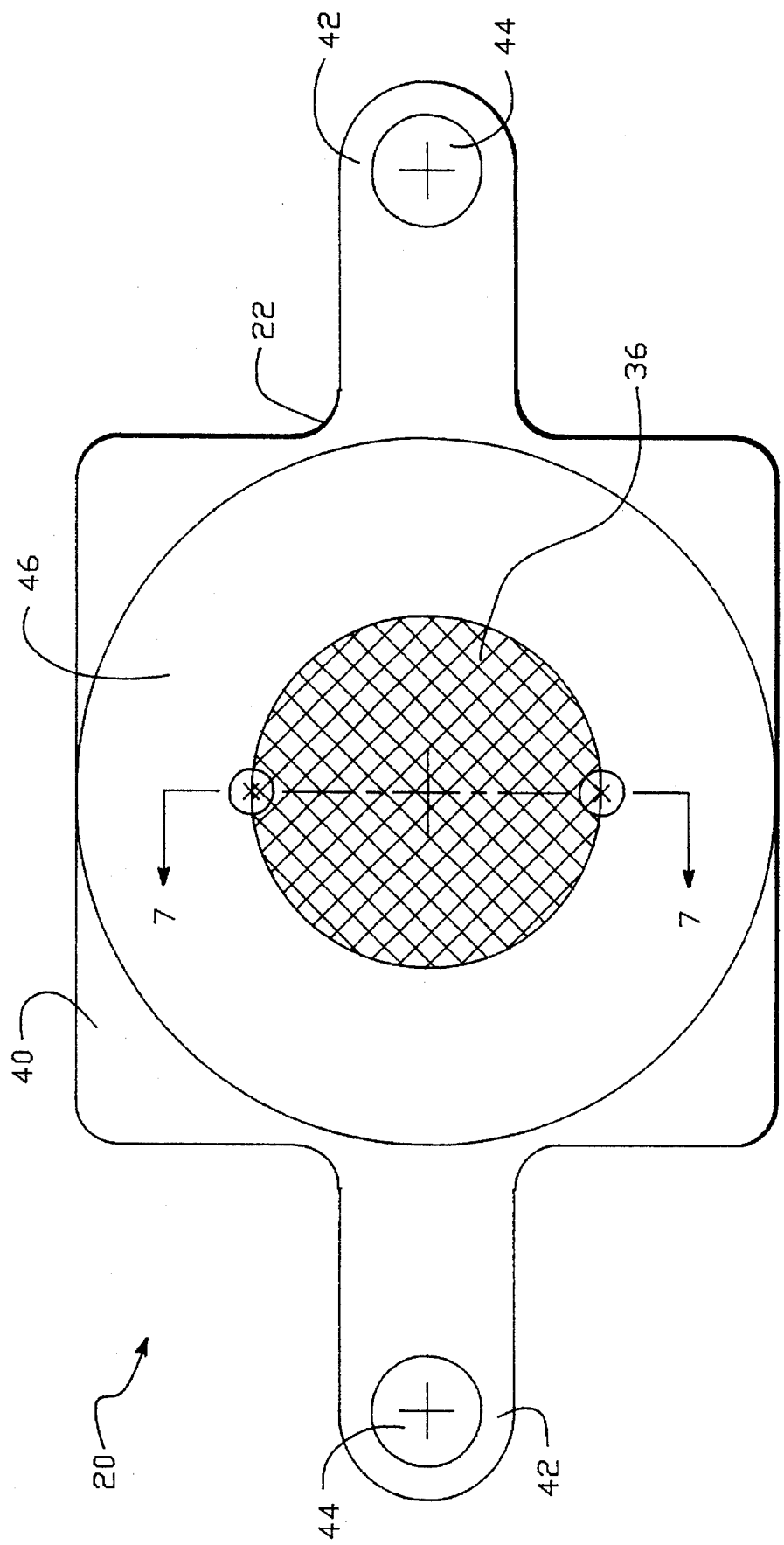
FIG. 6 is a top elevation view of the sensor of FIG. 5.

Referring to the illustrative drawing of FIG. 6, there is shown a top elevation view of the first pressure sensor 20. The header body 22 has a rectangular base 40. The circuit board 28, which is not visible in FIG. 6, also is rectangular and is secured to generally flat regions of the bottom side (not visible) of the rectangular base 40. The header body 22 includes two flanges 42 which extend from opposite sides of the rectangular base and which have holes 44 formed therein to receive fastening means (not shown) used to secure the pressure sensor 20 in place. The header body 22 also includes the cylindrical housing 46 which upstands from the rectangular base 40 and defines the cavity 24.

Referring to both FIGS. 5 and 6, the housing 46 has a top opening which is covered by the flexible molded-in-place diaphragm 36. A bottom side of the header 22, which otherwise would be open, is enclosed by the circuit board 28 with the gel-cup (or container) 26 mounted thereon. Thus, the cavity 24 within the header housing 46 is completely enclosed, and pressure can be transferred from the resilient diaphragm 36 through the encapsulating material 38 to the pressure transfer medium 21 and from there, to the pressure sensing device 23 isolated within the housing 46.

Figure 7:
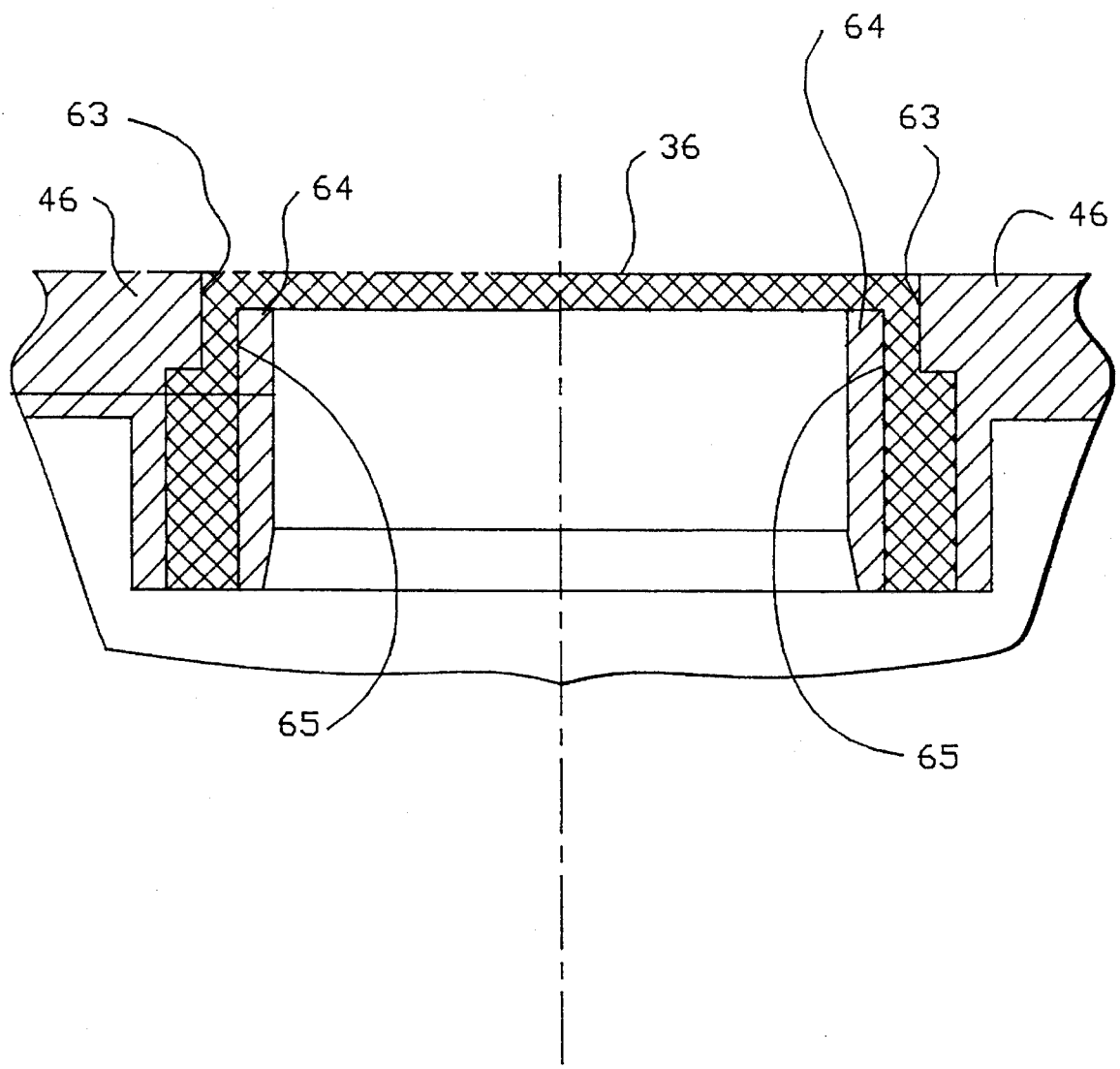
FIG. 7 is a cross-sectional fragmentary view along lines 7—7 in FIG. 6.

Referring to the illustrative drawings of FIG. 7 there is shown a cross-sectional fragmentary view along lines 7—7 in FIG. 6. As explained above, the header body is formed from a hard thermoplastic material. Both the header body 22 and the diaphragm 36 are quite resistant to a wide range of materials. Moreover, the diaphragm 36 is relatively soft and has a low spring rate which results in a reduced temperature induced offset which translates into more accurate pressure sensing across a range of temperatures.

Figure 8:
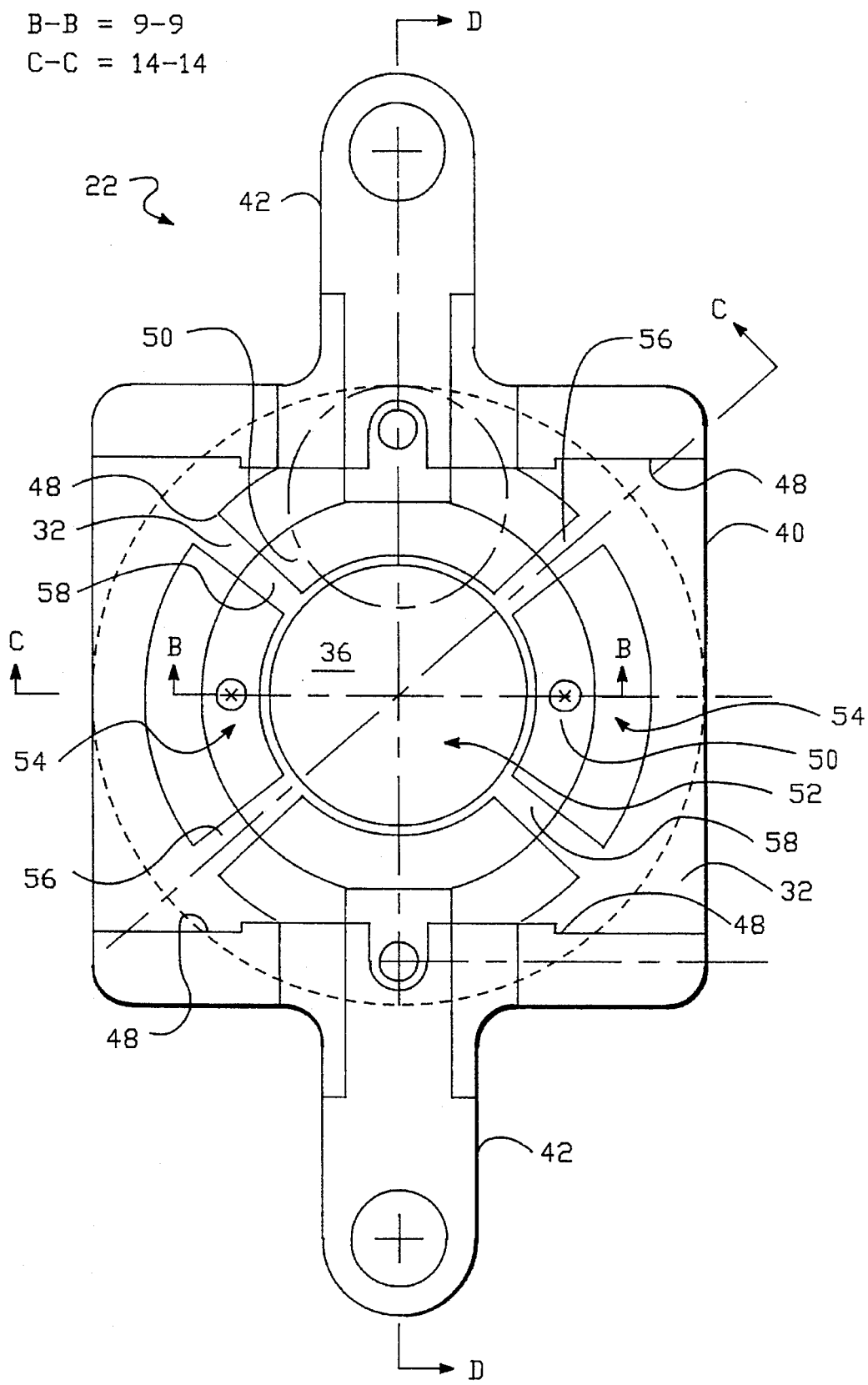
FIG. 8 is a bottom elevation view of the header alone of the sensor of FIG. 5.

Referring to the illustrative drawings of FIG. 8, there is shown a bottom elevation view of the header body 22. In this view, the circuit board 28 and the container 26 and the protective capsule 30 attached thereto are absent. The rectangular base 40 includes two oppositely disposed raised shoulders 48 adjacent to the flanges 42, the substantially flat regions 32 to which the circuit board 28 is secured extend between the shoulders 48 and the flanges 42. Thus, the flat regions 32 provide bonding surfaces for the circuit board 28, and the shoulders 48 define a slot in which the board fits.

In practice, the flat regions 32 are plasma etched to facilitate the epoxy connection of the circuit board 28 to the header base 40. The presently preferred plasma etch conditions are 500 Watts in an oxygen atmosphere for ten minutes. Even with plasma etched regions 32 epoxied to the board 28, however, clamps 37 still are employed to ensure that the circuit board provides a fixed ground plane relative to the header body 22.

An integral annular rim 50 upstands inwardly from the inner top of the housing 46 so as to surround the diaphragm 36. The rim 50 separates the top portion of the cylindrical housing 46 into two regions. First, an interior region 52 serves as a reservoir for the uncured encapsulating material 38. An inner side of the diaphragm 36 serves as a bottom side of the reservoir. Second, external spill-over regions 54 are disposed between an outer surface of the annular ring 50 and an inner surface of the housing 46.

During assembly of the sensor 20 the interior region or gel reservoir 52 is filled with uncured encapsulation material 38. The annular ring 50 confines the uncured material 38 so that when cured, the material hermetically seals the open top of the gel-cup 26 so that the diaphragm 36 is coupled to the pressure transfer medium 21 in the container 26. During assembly of the sensor 20, some of the uncured encapsulating material 38 may be spilled out of the interior region 52 as the top of the gel-cup 26 becomes immersed in the reservoir of the encapsulation material 38. That spilled material can be captured in the spill-over regions 54.

Multiple ribs 56 extend from the flat regions 32 across the spill-over regions 54 so as to divide the spill-over regions into multiple segmented regions 54. Each rib has an inclined surface 58 which, in a preferred embodiment, is inclined at an angle of approximately 15°, such that the ribs 56 define four inclined surfaces 58 which are used during insertion of the gel-cup 26 into the housing 46 to avoid trapping gases or voids within the uncured material 38 within the reservoir 52.

Figure 9:
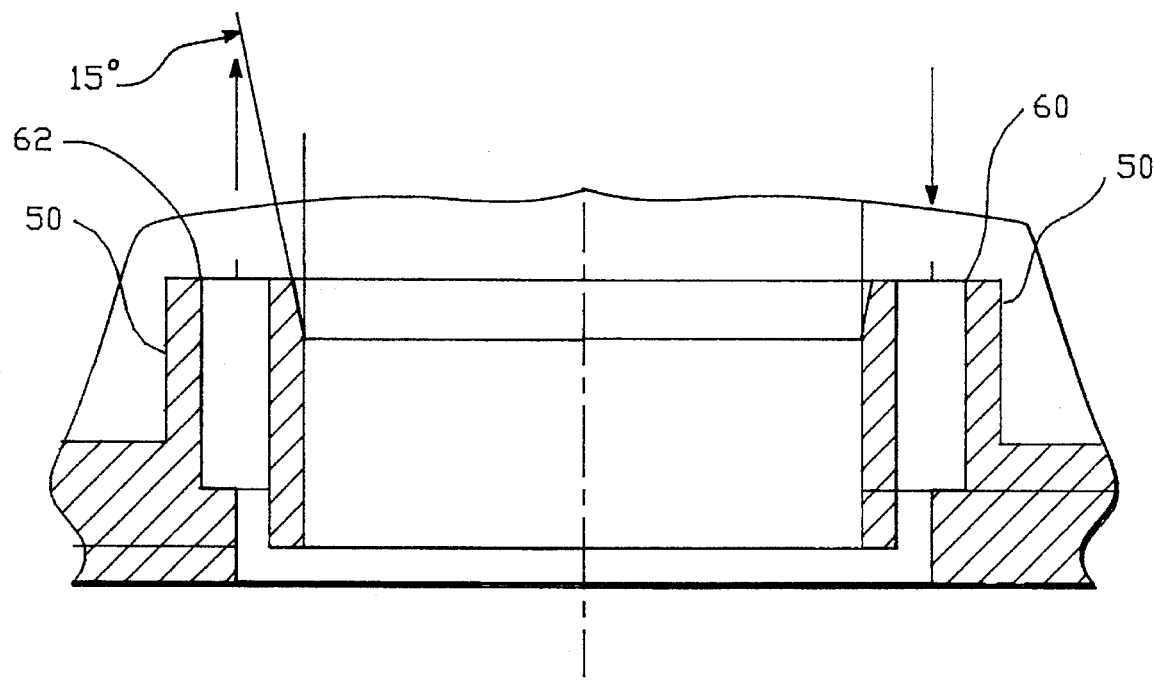
FIG. 9 is a cross-sectional fragmentary view along lines 9—9 in FIG. 6.

Referring to the illustrative drawing of FIG. 9, there is shown a cross-sectional fragmentary view along lines 9—9 of FIG. 8. During production of the diaphragm 36, the header body 22, is placed in a steel mold frame (not shown) which forms no part of the present invention and which will be understood by those skilled in the art without further explanation. The mold frame is shaped to the contour of the diaphragm. The cylindrical header housing 46 has two vents 60 and 62 formed in it. The vents extend vertically through diametrically opposite sides of the cylindrical ring 50. Molten diaphragm material in uncured flowable form is heated and is injected into a gate vent 60 as indicated by the arrow. The hot material conforms to the mold contour, and excess material escapes through an outlet vent 62 as shown by the arrow. The injected material cures to form the diaphragm 36.

In a present embodiment, the diaphragm has a convex or domed shape. It bows upward somewhat from the otherwise flat top surface of the cylindrical housing 46. An advantage of this is that it is easier to interfit with an external concave disk surface, which forms no part of the present invention, to which the measurand pressure is applied. While the present embodiment includes a circular convex diaphragm, diaphragms in other shapes can be used as well. For example, the diaphragm could be flat, concave or even convoluted.

An advantage of producing a unitary overmolded header as described above is that the diaphragm shrinks somewhat as it cools. As a result, it possesses built in tension which keeps it in a null-state without undesired back-pressure. Another advantage is that the diaphragm is securely attached to the hard header body, and has many of the same durable properties as the header body since the diaphragm and the header body are formed from a common base material. These qualities include good resistance to a wide range of chemicals and good tear resistance. Still another advantage is that the molding process is accurately repeatable which can result in more reliably produced pressure sensors.

In the present embodiment, during the injection molding process described above, the molten diaphragm material is heated to a temperature sufficient to melt surfaces of the header body 22 that it contacts. Since the molten diaphragm and the header body are formed from the same base materials, they become bonded directly to one another upon cooling so as to form one continuous structure which comprises the hard header body and the resilient diaphragm 36.

More specifically in the preferred embodiment, the Santoprene is heated to approximately 560° F. Upon cooling, a continuous crystalline structure is formed across what was the boundary between the molten Santoprene and the header body. Thus, a unitary overmolded header with a hard header body and a resilient diaphragm is formed.

It will be appreciated that alternate thermoplastic base materials and filler materials can be used in accordance with the invention. Furthermore, the temperature of the molten diaphragm material will vary depending upon the materials used and desired properties.

It will be noted that in FIG. 7, the vents 60 and 62 are filled with the diaphragm forming material and that the diaphragm 36 extends as one integral unit or member from the gate vent 60 to the outlet vent 62. In order to facilitate the bonding of the diaphragm forming material to the header housing 46, a concentric annular inner shoulder 63 and annular outer shoulder 65 define a moat 64 which extends about an interior portion of the opening in the top of the housing 46 across which the diaphragm 36 is formed. The shoulders 63 and 65 forming the moat 64 provide increased surface area for bonding.

Figure 10:
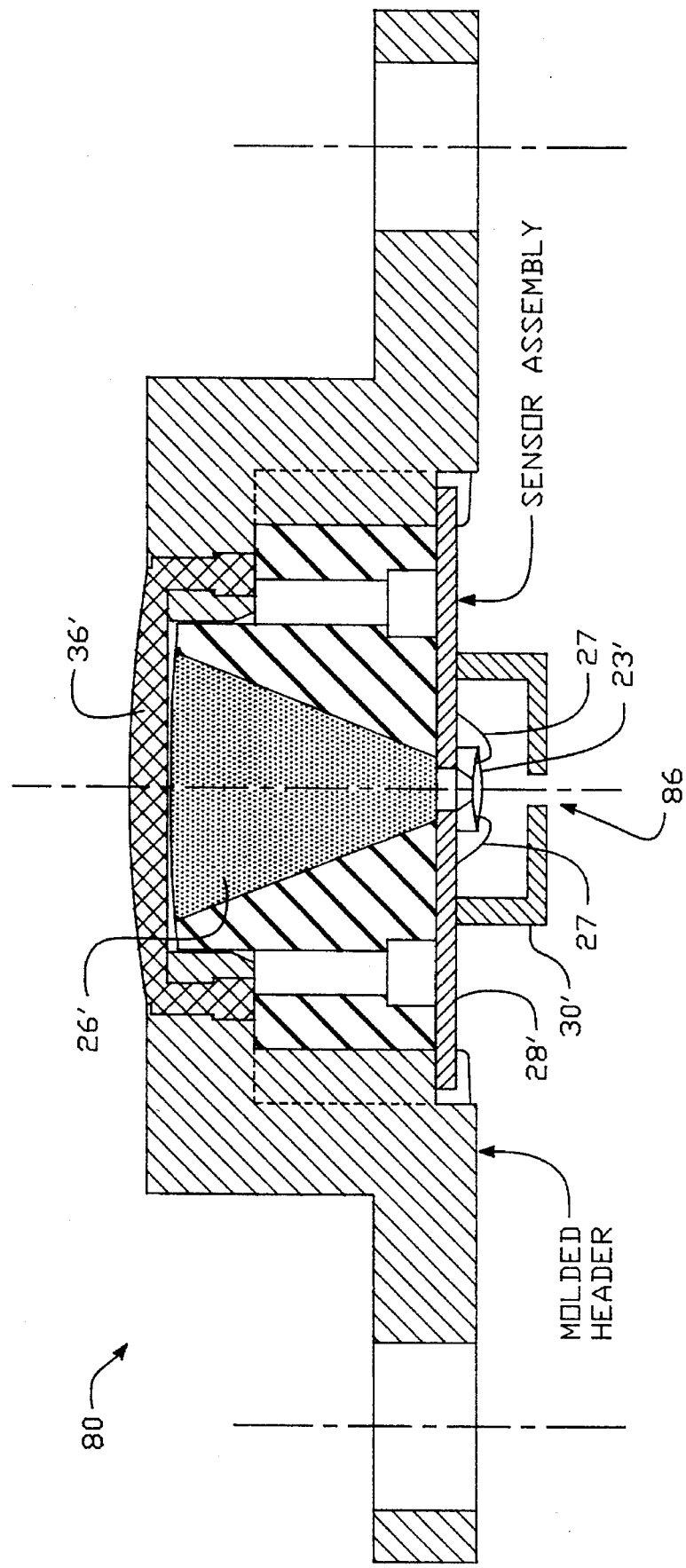
FIG. 10 is a cross-sectional view of a second pressure sensor in accordance with the invention.

Referring to the illustrative drawing of FIG. 10, there is shown a cross-sectional view of a second pressure sensor 80 in accordance with the present invention. Components of the second pressure sensor which are like or similar to those of the first pressure sensor 20 are indicated by primed reference numerals identical to those used in the description of the first pressure sensor. Moreover, components which are essentially the same in the first and second pressure sensors 20 and 80 will not be described again, since the description already provided for the first pressure sensor will suffice for those of ordinary skill in the art.

Figure 11:
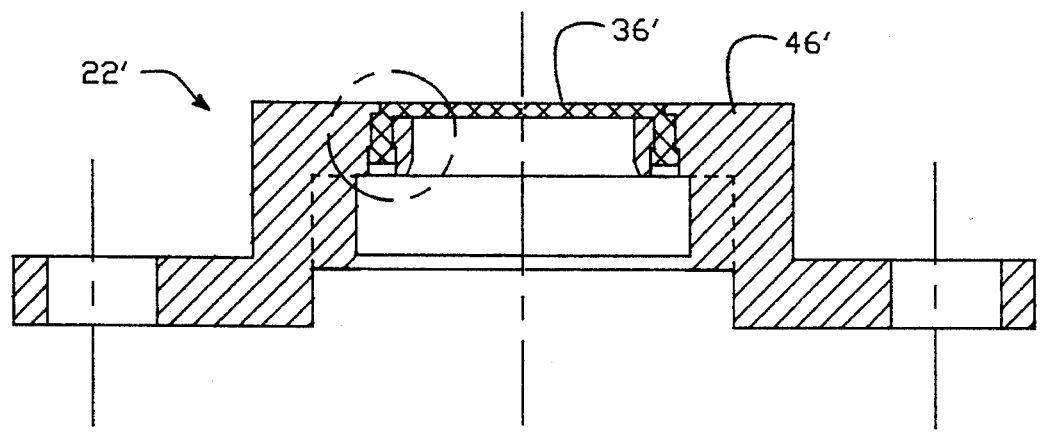
FIG. 11 is a cross-sectional view of the header alone of the second sensor of FIG. 10.
Figure 12:
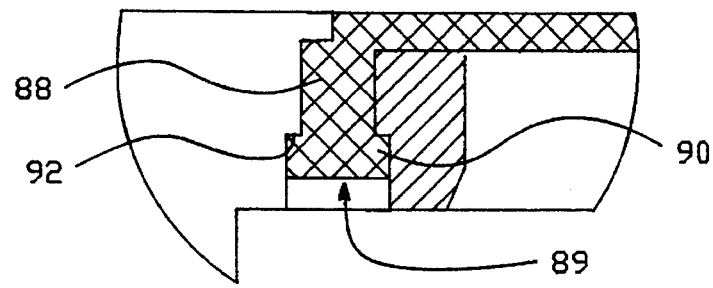
FIG. 12 is a cross-sectional fragmentary view illustrating a mechanical interlock of the header of FIGS. 10 and 11.
Figure 13:
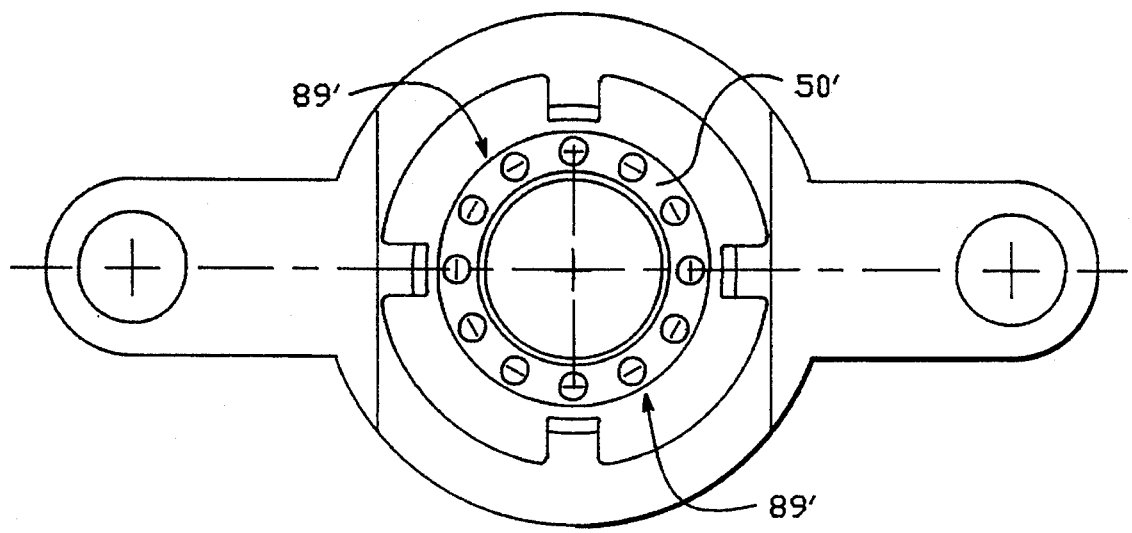
FIG. 13 is a bottom elevation view of the header alone of the sensor of FIG. 10.

Referring to the illustrative drawings of FIGS. 11, 12 and 13, there are shown different views of the header 22' portion of the second pressure sensor 80. The purpose of these drawings is to illustrate an alternative mechanism for securing the diaphragm 36' to the housing 46'. This alternate locking mechanism permits the production of a unitary header with resilient diaphragm even though the header body and the diaphragm are formed from different base materials that cannot be bonded directly together.

The illustrative drawing of FIG. 11 shows a side cross-sectional view of the header 22'. FIG. 12 shows an enlarged view of a portion of the header 22'. FIG. 13 shows a bottom elevation view of the header 22'. A plurality of holes 89 are formed through the annular ring 50'. During injection of the molten diaphragm forming material through the inlet and outlet vents, not only is the diaphragm 36' formed, but also each of the plurality of holes 89 is filled with that same material such that a plurality of pillars 88 are formed integrally with the diaphragm 36'. Each pillar 88 depends downwardly from the diaphragm 36' within the annular ring 50'. The holes 88 are contoured, as shown in FIG. 12, such that when the injected material cools an enlarged integral base 90 is formed on each pillar and is interlocked with an annular shoulder 92 within each hole 89.

The plurality of pillars 88 formed in the plurality of holes 89 are interlocked against the shoulders 92 within the holes 89 to form mechanical interlocks which hold the diaphragm 36' in place. Such mechanical interlocks can be used independently of the bonds described above in relation to the first pressure sensor 20. Alternatively, such mechanical interlocks can be used to supplement such bonding.

Figure 14:
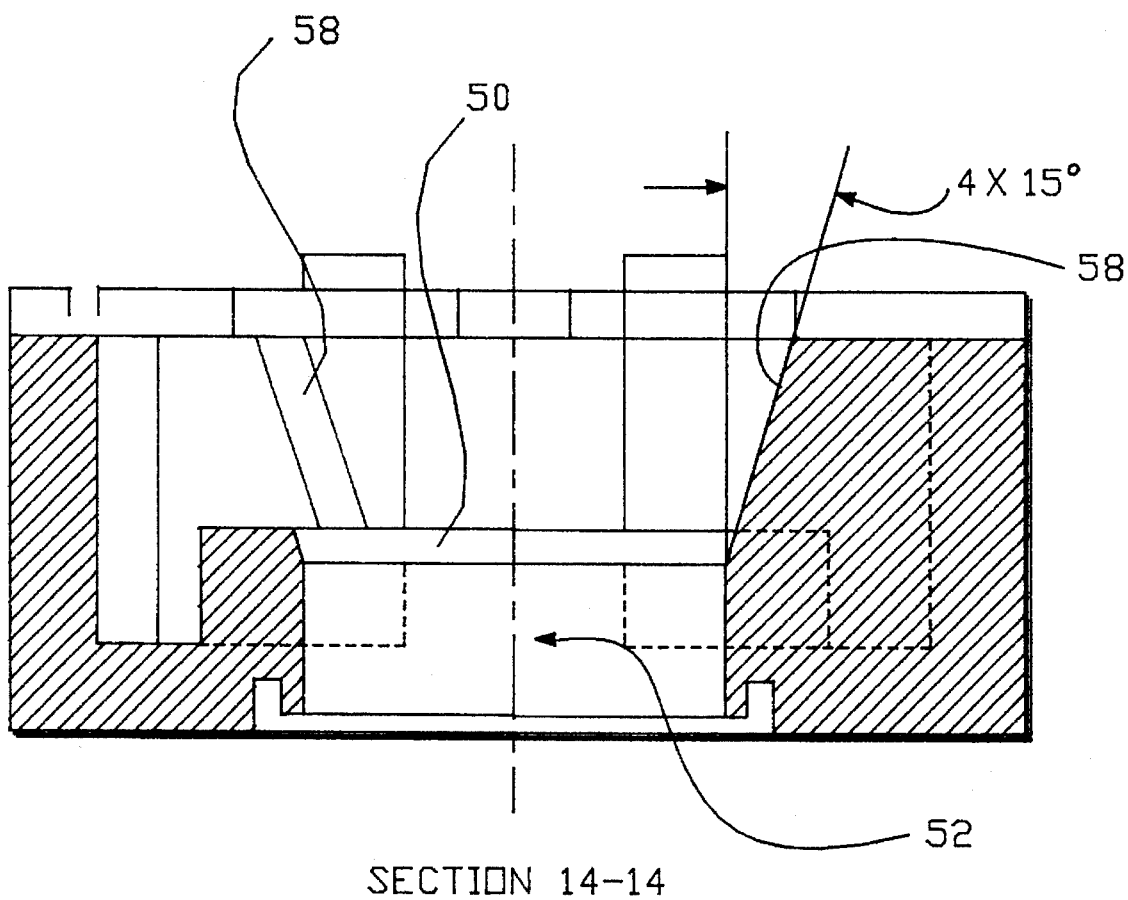
FIG. 14 is a cross-sectional fragmentary view of the header alone along lines 14—14 in FIG. 8.

Referring to the illustrative drawings of FIG. 14, there is shown a cross-sectional fragmentary view of the housing 46 of the first pressure sensor 20 taken along lines 14—14 of FIG. 8. During assembly of the sensor 20, the inclined faces 58 serve as ramps or guides for the insertion of the gel-cup 26 into the interior reservoir region 52 defined by the annular ring 50. More specifically, during assembly, the housing cavity 24 has uncured encapsulating material poured into the interior reservoir region 52. The gel-cup is filled with cured gel which serves as the pressure transfer medium 38. The top of the gel-cup 26 is inserted into the reservoir 52.

One challenge associated with the insertion of the gel-cup 26 is to avoid the trapping of gas or voids within the pressure transfer medium 38 between the diaphragm 36 and the sensor device 23. The inclined faces 58 of the ribs 56 help to avoid this problem by serving as guides that can be used to insert the gel-cup at an angle. This permits gas and voids to escape as the gel-cup gradually becomes submerged in the uncured encapsulating material in the reservoir region 52.

Figure 15:
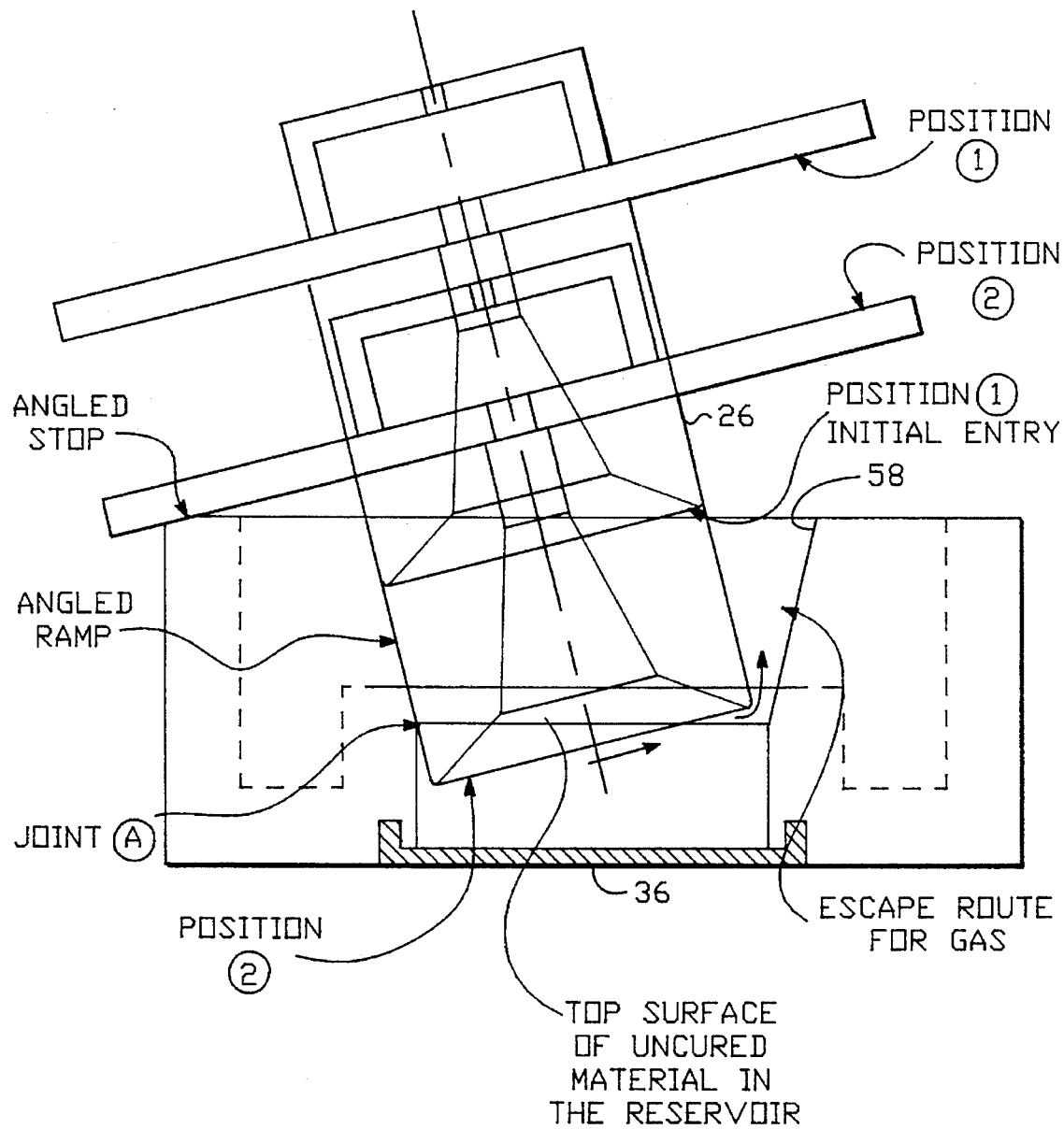
FIG. 15 is a stylized drawing showing two positions of a gel-cup and circuit board as the gel-cup is inserted into an internal reservoir region within the housing of a header of the first or second pressure sensors.

Referring to the illustrative drawing of FIG. 15 there is shown a stylized drawing indicating two stages in the path of motion of the gel-cup 26 during its insertion into the reservoir region 52. The drawing is intended to indicate the insertion of a single cup. However, the drawing indicates that same cup at two positions. In the first position, the gel-cup is shown inclined relative to the housing 46 before insertion in to the reservoir and following an angled path defined by the inclined face 58 of one or more of the ribs 56. Following the inclined rib face 58 ensures that the cup contacts the fluid material in the reservoir 52 at an angle. The second position shown in FIG. 15 illustrates the cup contacting the surface of the fluid material at an angle such that any gas which might otherwise be trapped is able to escape as indicated by the arrows. As the cup continues to follow the angled path the circuit board 28 abuts the base 40 of the header 22 causing the cup to rotate into its final vertical position within the header 22. Moreover, excess fluid within the reservoir 52 can be pushed over the top of the ring 50 and can spill into the exterior spill-over regions 54 which are shown in the illustrative drawings of 8.

At the same time the gel-cup is being ramped into place within the header cavity 24, the circuit board 28 is epoxied to the header base 40. During assembly, the ring 50 defines the reservoir 52 for the uncured encapsulating material. The encapsulating material itself is degassed prior to its introduction into the reservoir 52. The encapsulating material cures at room temperature. Once cured it serves to couple the diaphragm to the pressure transfer medium by hermetically sealing the medium within the header housing 46. When assembly is complete, the inwardly upstanding ring 50 serves as a receptacle within which the top of the gel-cup 26 and the pressure transfer medium 38 therein are encapsulated.

One advantage to using different types of gels for the pressure transfer medium 21 and the encapsulating medium 38 has to do with the effects of curing over time. Some gels tend to become harder with time as they continue to cure. To avoid this problem, a softer gel was selected as the pressure transfer medium 21. However, since the encapsulating material 38 is intended in part to prevent extrusion of the medium 21, a harder gel was selected.

While various embodiments of the invention have been described in detail, it will be appreciated that changes to those embodiments can be made without departing from the spirit and scope of the invention in which:

What is claimed is:

1. A pressure transducer for measuring pressure within a measurand environment comprising:
   a header which includes a substantially nondeformable molded housing formed from first material having a thermoplastic base material defining a cavity; said cavity having a first opening formed therein; a resilient diaphragm formed from a second material having the same thermoplastic base material as said first material; said diaphragm molded to the said housing and spanning the first opening; and
   a pressure sensing device secured in place within the housing; and
   a pressure transfer medium disposed within the cavity so as to couple the diaphragm to said pressure sensing device.

2. The pressure transducer of claim 1 wherein the base material is polypropylene.

3. The pressure transducer of claim 1, wherein the first material is glass filled polypropylene, and the second material is rubber filled polypropylene.

4. The pressure transducer of claim 3, wherein the first material is about thirty percent glass.

5. The pressure transducer of claim 1, wherein the resilient diaphragm has a convex shape.

6. The pressure transducer of claim 1, wherein the resilient diaphragm has a substantially unbiased rest state such that the pressure transfer medium is substantially free from back-pressure from the resilient diaphragm when the resilient diaphragm is in the rest state.

7. The pressure transducer of claim 6, wherein the resilient diaphragm has a convex shape when it is in the rest state.

8. The pressure transducer of claim 1, further comprising a container disposed in the cavity between the resilient diaphragm and the pressure sensing device, wherein the pressure transfer medium is substantially confined to the container.

9. The pressure transducer of claim 8, wherein the container has a first end coupling a first surface area of the pressure transfer medium to the diaphragm and a second end coupling a second surface area of the pressure transfer medium to the pressure sensing device, the second surface area being smaller than the first surface area, and the container tapering between the first end and the second end.

10. The pressure transducer of claim 8, further comprising encapsulating material formed from a gel that is curable at room temperature, wherein the container and the pressure transfer medium are coupled to the diaphragm by the encapsulating material.

11. The pressure transducer of claim 10, wherein the encapsulating material is formed from dimethyl silicone gel and the pressure transfer medium is formed from fluorosilicone.

12. A pressure transducer for measuring pressure within a measurand environment comprising:
   a header which includes a substantially nondeformable molded housing formed from a first material having a thermoplastic base material defining a cavity and a first opening into the cavity and a resilient diaphragm formed from a second material having the same base material as the first material molded to the housing and spanning the first opening;
   a pressure sensing device secured in place within the housing; and
   a pressure transfer medium disposed within the cavity so as to couple the diaphragm to said pressure sensing device;
   wherein the housing defines a shoulder formed around the first opening and the resilient diaphragm is molded directly to the shoulder of the housing.

13. A pressure transducer for measuring pressure within a measurand environment comprising:
   a header which includes a substantially nondeformable molded housing formed from a first material having a thermoplastic base material defining a cavity and a first opening into the cavity and a resilient diaphragm formed from a second material having the same base material as the first material molded to the housing and spanning the first opening;
   a pressure sensing device secured in place within the housing; and
   a pressure transfer medium disposed within the cavity_ so as to couple the diaphragm to said pressure sensing device;
   wherein the housing defines a moat formed around the first opening and the resilient diaphragm is molded to the housing in said moat.

14. A pressure transducer for measuring pressure within a measurand environment comprising:
   a header which includes a substantially nondeformable molded housing formed from a first material having a thermoplastic base material defining a cavity and a first opening into the cavity and a resilient diaphragm formed from a second material having the same base material as the first material molded to the housing and spanning the first opening;
   a pressure sensing device secured in place within the housing;
   a pressure transfer medium disposed within the cavity so as to couple the diaphragm to said pressure sensing device; and
   a container disposed in the cavity between the resilient diaphragm and the pressure sensing device, wherein the pressure transfer medium is substantially confined to the container: wherein the housing defines a reservoir of encapsulating material and the container is coupled to the diaphragm by the encapsulating material in said reservoir.

15. A pressure transducer for measuring pressure within a measurand environment comprising:

- a header which includes a substantially nondeformable molded housing formed from a first material having a thermoplastic base material defining a cavity and a first opening into the cavity and a resilient diaphragm formed from a second material having the same base material as the first material molded to the housing and spanning the first opening;
- a pressure sensing device secured in place within the housing;
- a pressure transfer medium disposed within the cavity so as to couple the diaphragm to said pressure sensing device; and
- a container disposed in the cavity between the resilient diaphragm and the pressure sensing device, wherein the pressure transfer medium is substantially confined to the container; wherein the housing defines a reservoir of encapsulating material and the container is coupled to the diaphragm by the encapsulating material in said reservoir, and wherein the housing further defines spill over regions disposed about said reservoir.

16. The pressure transducer of claim 1, wherein the housing defines an inclined surface in the cavity slanting outward from the first opening.

17. The pressure transducer of claim 8, wherein the housing defines an inclined surface in the cavity slanting outward from the first opening.

18. The pressure transducer of claim 14, wherein the housing defines an inclined surface in the cavity slanting outward from the first opening.

19. The pressure transducer of claim 1, wherein the housing defines a second opening into the cavity and said pressure sensing device spans said second opening.

20. The pressure of claim 19, wherein said pressure sensing device has a first side exposed to the pressure transfer medium and a second side exposed to a reference pressure.

21. The pressure transducer of claim 20, wherein the second side of said pressure sensing device is enclosed within a protective structure.

22. The pressure transducer of claim 20, wherein the second side of said pressure sensing device includes bonded electrical connections.

23. A pressure transducer for measuring pressure within a measurand environment comprising:

- a header which includes a substantially nondeformable molded housing formed from a first material having a thermoplastic base material defining a cavity and first and second openings into the cavity and a resilient diaphragm formed from a second material having the same base material as the first material molded to the housing and spanning the first opening; and
- a pressure sensing device spanning the second opening;
- a container disposed in the cavity between the resilient diaphragm and the pressure sensing device; and
- a pressure transfer medium disposed within the container so as to couple the diaphragm to said pressure sensing device.

* * * * *